(12) United States Patent
Park et al.

(10) Patent No.: US 9,672,987 B2
(45) Date of Patent: Jun. 6, 2017

(54) MULTILAYER CERAMIC CAPACITOR AND BOARD HAVING THE SAME

(71) Applicant: SAMSUNG ELECTRO-MECHANICS CO., LTD., Suwon-Si, Gyeonggi-Do (KR)

(72) Inventors: Sang Soo Park, Suwon-Si (KR); Min Cheol Park, Suwon-Si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 49 days.

(21) Appl. No.: 14/664,260

(22) Filed: Mar. 20, 2015

(65) Prior Publication Data
US 2016/0049252 A1 Feb. 18, 2016

(30) Foreign Application Priority Data
Aug. 14, 2014 (KR) ........................ 10-2014-0106308

(51) Int. Cl.
| | |
|---|---|
| *H01G 4/30* | (2006.01) |
| *H01G 4/228* | (2006.01) |
| *H01G 4/06* | (2006.01) |
| *H01G 4/232* | (2006.01) |
| *H01G 4/012* | (2006.01) |
| *H01G 4/38* | (2006.01) |
| *H01G 4/12* | (2006.01) |
| *H05K 3/34* | (2006.01) |

(52) U.S. Cl.
CPC ............. *H01G 4/30* (2013.01); *H01G 4/012* (2013.01); *H01G 4/232* (2013.01); *H01G 4/385* (2013.01); *H01G 4/12* (2013.01); *H05K 3/3442* (2013.01); *H05K 2201/10015* (2013.01); *H05K 2201/10636* (2013.01); *Y02P 70/611* (2015.11)

(58) Field of Classification Search
CPC ........... H01G 4/30; H01G 4/232; H01G 4/228
USPC ................................ 361/306.3, 306.1, 301.4
See application file for complete search history.

(56) References Cited

U.S. PATENT DOCUMENTS

| | | | |
|---|---|---|---|
| 6,270,613 | B1 | 8/2001 | Nakagawa et al. |
| 7,675,733 | B2 † | 3/2010 | Lee |

(Continued)

FOREIGN PATENT DOCUMENTS

| | | |
|---|---|---|
| JP | 11-045837 A | 2/1999 |
| JP | 2007-235170 A | 9/2007 |

*Primary Examiner* — Eric Thomas
*Assistant Examiner* — Arun Ramaswamy
(74) *Attorney, Agent, or Firm* — McDermott Will & Emery LLP

(57) ABSTRACT

A multilayer ceramic capacitor and a board having the same are provided. The multilayer ceramic capacitor includes external electrodes disposed on both end surfaces of a ceramic body and a mounting surface to be spaced apart from each other in a width direction, respectively, first internal electrodes connected to the left and right external electrodes, second internal electrodes having lead-out portions to be connected to the external electrodes disposed on the mounting surface. The ceramic body includes a first region positioned in a center portion thereof in the width direction and second regions positioned in both side portions in the width direction, with the first region therebetween, the plurality of first internal electrodes are disposed in the first region, and the first and second internal electrodes are alternately disposed in the second regions.

8 Claims, 6 Drawing Sheets

(56) References Cited

U.S. PATENT DOCUMENTS

2013/0250476 A1* 9/2013 Chung .................... H01G 4/30
361/303
2015/0041198 A1* 2/2015 Lee ......................... H01G 2/06
174/260

\* cited by examiner
† cited by third party

MULTILAYER CERAMIC CAPACITOR AND BOARD HAVING THE SAME

CROSS-REFERENCE TO RELATED APPLICATION

This application claims the priority and benefit of Korean Patent Application No. 10-2014-0106308 filed on Aug. 14, 2014, with the Korean Intellectual Property Office, the disclosure of which is incorporated herein by reference.

BACKGROUND

The present disclosure relates to a multilayer ceramic capacitor and a board having the same.

Due to the increase in current consumption of various products due to the multifunctionalization and increasingly high level integration of large scale integration (LSI) circuits, a three terminal penetration capacitor having excellent high frequency properties is widely used in order to remove or reduce noise generated in a high frequency circuit such as a power supply circuit, or the like, of such LSI circuits.

In such a three terminal penetration capacitor, a high maximum allowable current is required since the current consumption is increased due to the multifunctionalization and increasingly high level integration of large scale integration (LSI) circuits. In order to achieve such a high maximum allowable current in a three terminal penetration capacitor, direct current (DC) resistance of the three terminal penetration capacitor should be decreased.

Therefore, the three terminal penetration multilayer ceramic capacitor needs to satisfy high frequency performance and low DC resistance in order to stabilize the power supply circuit and effectively remove noise at high frequencies.

SUMMARY

An aspect of the present disclosure may provide a multilayer ceramic capacitor capable of reducing direct-current (DC) resistance to implement a high current flow therein, having a small size, and effectively removing high frequency noise, and a board having the same.

According to an aspect of the present disclosure, a multilayer ceramic capacitor and a board having the same are provided. The multilayer ceramic capacitor includes external electrodes disposed on both end surfaces of a ceramic body in a length direction of the ceramic body and a mounting surface to be spaced apart from each other in a width direction of the ceramic body, respectively, first internal electrodes connected to the left and right external electrodes in the ceramic body, second internal electrodes having lead-out portions to be connected to the external electrodes disposed on the mounting surface, wherein the ceramic body includes a first region positioned in a center portion thereof in the width direction and second regions positioned in both side portions thereof in the width direction, with the first region interposed therebetween, the plurality of first internal electrodes being disposed in the first region, and the first and second internal electrodes being alternately disposed in the second regions.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
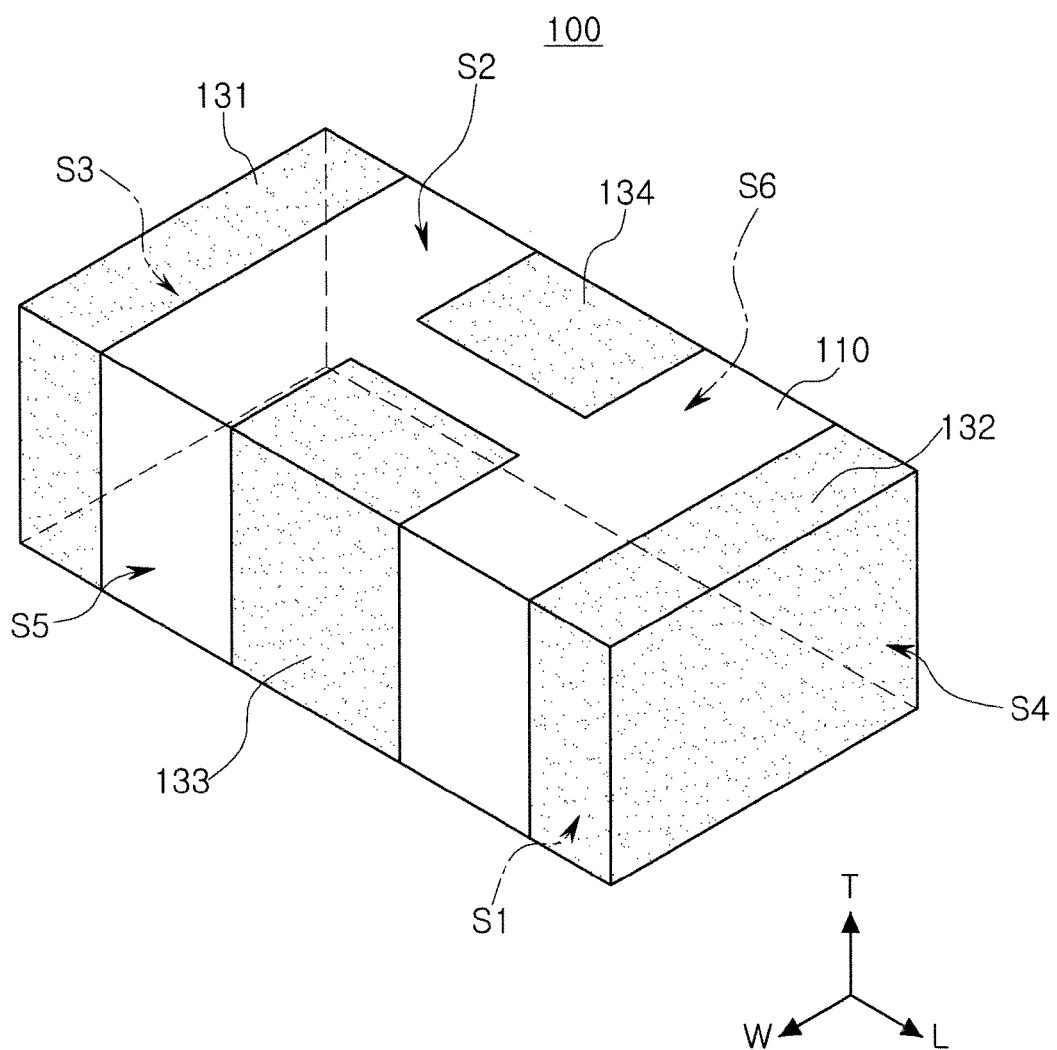
FIG. 1 is a perspective view schematically illustrating a multilayer ceramic capacitor according to an exemplary embodiment in the present disclosure.

Exemplary embodiments in the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

Directions of a hexahedron will be defined in order to clearly describe the exemplary embodiment in the present disclosure. L, W and T illustrated in FIG. 1 refer to a length direction, a width direction, and a thickness direction, respectively. Here, the width direction may be the same as a stacking direction in which dielectric layers are layered.

Multilayer Ceramic Capacitor

Figure 2:
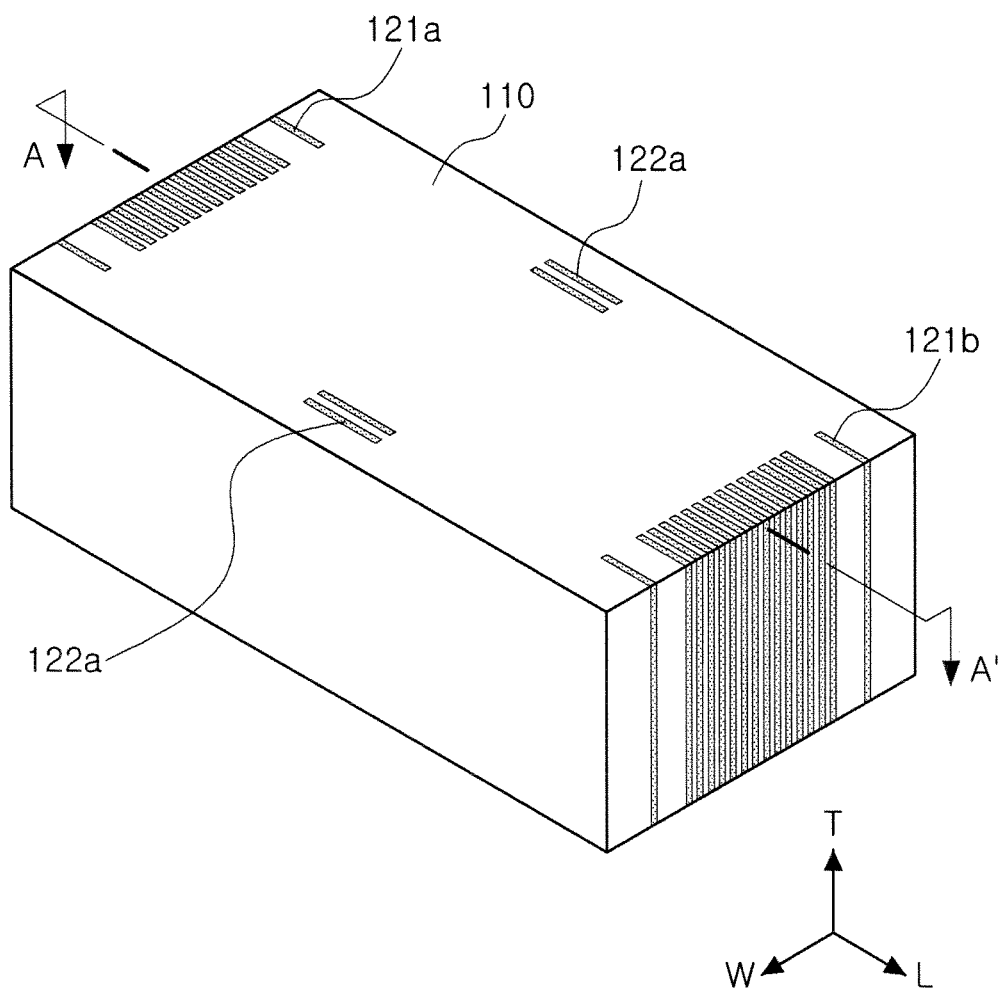
FIG. 2 is a perspective view illustrating the multilayer ceramic capacitor of FIG. 1 from which external electrodes are omitted.
Figure 3A:
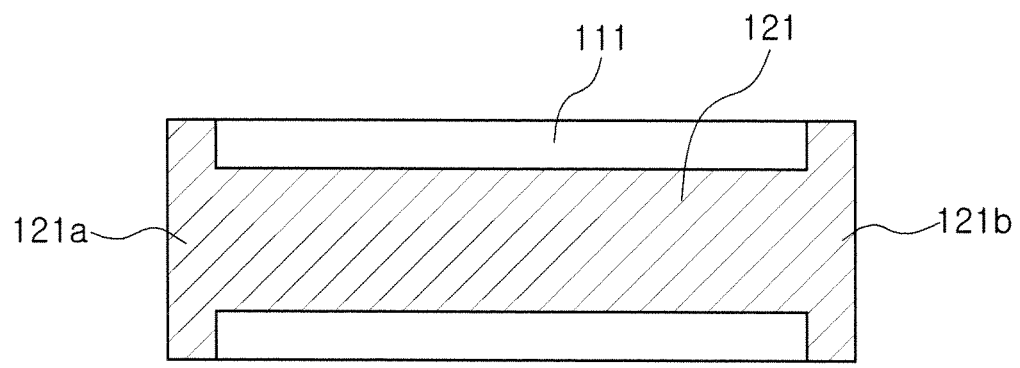
FIGS. 3A and 3B are plan views illustrating a structure of internal electrodes of the multilayer ceramic capacitor of FIG. 1.
Figure 3B:
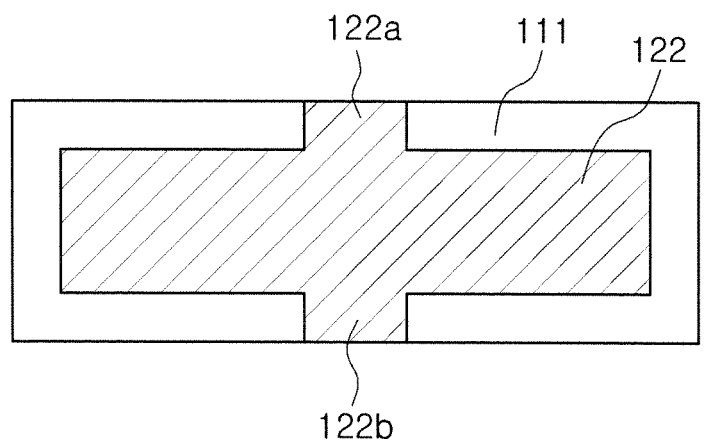
Figure 4:
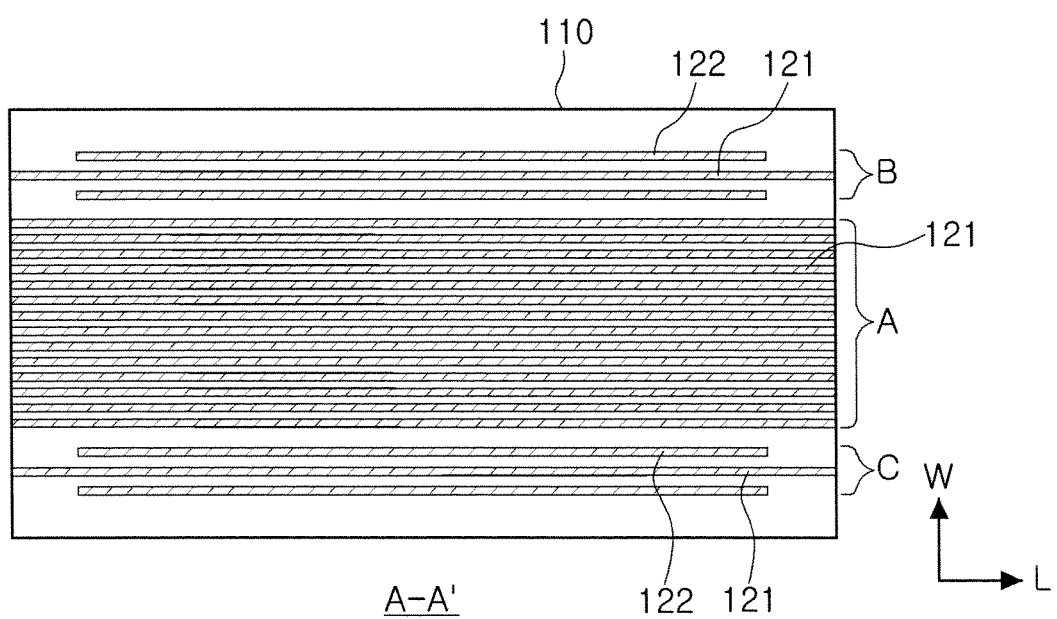
FIG. 4 is a cross-sectional view taken along line A-A' of FIG. 2.
Figure 5:
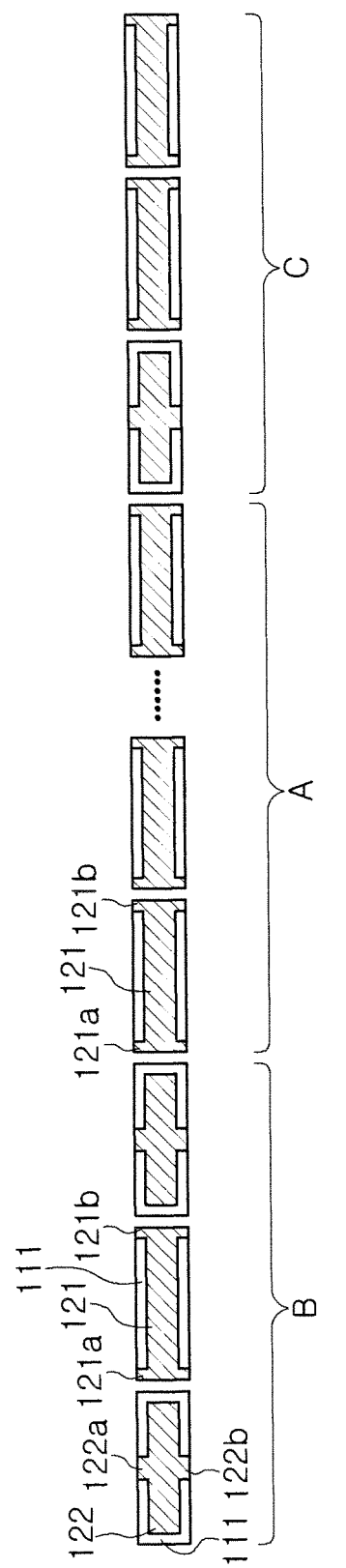
FIG. 5 is a plan view schematically illustrating a structure in which internal electrodes of the multilayer ceramic capacitor of FIG. 1 are arranged.

FIG. 1 is a perspective view schematically illustrating a multilayer ceramic capacitor according to an exemplary embodiment in the present disclosure, FIG. 2 is a perspective view illustrating the multilayer ceramic capacitor of FIG. 1 from which external electrodes are omitted, FIG. 3 is a plan view illustrating a structure of internal electrodes of the multilayer ceramic capacitor of FIG. 1, FIG. 4 is a cross-sectional view taken along line A-A' of FIG. 2, and FIG. 5 is a plan view schematically illustrating a structure in which internal electrodes of the multilayer ceramic capacitor of FIG. 1 are arranged.

Referring to FIGS. 1 through 5, the multilayer ceramic capacitor 100 according to the present exemplary embodiment may include a ceramic body 110 including a plurality of dielectric layers 111 layered in the width direction, first and second internal electrodes 121 and 122, first and second external electrodes 131 and 132 disposed on both end surfaces of the ceramic body 110 in a length direction, and third and fourth external electrodes 133 and 134 disposed on the mounting surface of the ceramic body 110 to be spaced apart from each other in the width direction.

The multilayer ceramic capacitor of the present exemplary embodiment may be regarded as a three terminal penetration capacitor.

The ceramic body 110 may be formed by stacking the plurality of dielectric layers 111 in the width direction and performing a sintering process.

Here, the plurality of dielectric layers 111 forming the ceramic body 110 may be in a sintered state, and may be integrated with each other so that boundaries therebetween are not readily apparent without using a scanning electron microscope (SEM).

In addition, a thickness of the dielectric layer 111 may be optionally changed according to a capacitance design of the multilayer ceramic capacitor 100, and in detail, the thickness of one dielectric layer 111 may be configured to be 1.0 to 10.0 μm after sintering. However, the present disclosure is not limited thereto.

Further, the dielectric layer 111 may include a high-k ceramic powder, for example, a barium titanate ($BaTiO_3$) based powder or a strontium titanate ($SrTiO_3$) based powder, or the like. However, the present disclosure is not limited thereto as long as sufficient capacitance may be obtained.

Further, in addition to the ceramic powder, the dielectric layer 111 may further include ceramic additives, organic solvents, plasticizers, binders, dispersants, and the like, as necessary.

An example of the ceramic additives may include transition metal oxides or carbides, rare earth elements, magnesium (Mg), aluminum (Al), and the like. However, the present disclosure is not limited thereto.

In addition, an average particle diameter of the ceramic powder used in forming the dielectric layer 111 is not particularly limited, and may be controlled, for example, as 400 nm or less according to an exemplary embodiment in the present disclosure.

The ceramic body 110 may have a hexahedral shape as illustrated in the drawings. However, the present disclosure is not particularly limited thereto. A shape and a dimension of the ceramic body 110, and the number of layered dielectric layers 111 are illustrated in the drawings, but are not limited thereto.

In the present exemplary embodiment, the ceramic body 110 may have first and second main surfaces S1 and S2 opposing each other in a thickness direction, first and second end surfaces S3 and S4 connecting the first and second main surfaces S1 and S2 to each other and opposing each other in the length direction, and first and second side surfaces S5 and S6 opposing each other in the width direction. Hereinafter, the mounting surface of the multilayer ceramic capacitor 100 may be defined as the first main surface S1 of the ceramic body 110.

In addition, the ceramic body 110 may include cover layers formed on the third and fourth side surfaces S5 and S6 of the ceramic body 110, respectively, as margin parts.

The cover layers may have the same material and configuration as those of the dielectric layer 111 except that the internal electrodes are not included therein.

In addition, the cover layers may be formed by stacking a single dielectric layer or two or more dielectric layers on the third and fourth side surfaces S5 and S6 of left and right second regions (B and C) to be described below in the width direction, respectively, and may basically prevent damage of the first and second internal electrodes 121 and 122 caused by physical or chemical stress.

The ceramic body 110 of the present exemplary embodiment may include a first region A positioned in a center portion thereof in the width direction and second regions B and C positioned in both sides of the ceramic body 110 in the width direction, respectively, with the first region A interposed therebetween.

The first region A may be formed by repeatedly stacking the plurality of first internal electrodes 121 in the width direction of the ceramic body 110, with the dielectric layer 111 interposed therebetween. The DC resistance of the capacitor may be in inverse proportion to the number of layered internal electrodes included in the first region A. Therefore, when the number of layered first internal electrodes 121 in the first region A is increased, DC resistance may be decreased, such that an allowable current value of the capacitor may be increased.

Here, in order to increase the number of layered internal electrodes of the first region A, an interlayer size of the dielectric layer of the first region A may be decreased, such that an electrode density may be increased.

The second regions B and C may be formed by alternately and repeatedly stacking at least one of the first and second internal electrodes 121 and 122, with the dielectric layer 111 interposed therebetween. Here, a portion of the first and second internal electrodes 121 and 122 overlapped with each other may function as a capacitance layer, and may contribute to a capacitance of the capacitor.

The first and second internal electrodes 121 and 122, which are electrodes having different polarities, may be disposed in the ceramic body 110, and may be electrically insulated from each other by the dielectric layers 111 disposed therebetween.

In addition, the first and second internal electrodes 121 and 122 may be formed by using a conductive paste containing one of silver (Ag), palladium (Pd), platinum (Pt), nickel (Ni), and copper (Cu), alloys thereof, or the like. However, a material forming the first and second internal electrodes 121 and 122 is not particularly limited in the present disclosure.

Here, as a printing method of the conductive paste, a screen printing method, a gravure printing method, or the like, may be used. However, the present disclosure is not limited thereto.

The first internal electrodes 121 may be exposed through the first and second end surfaces S3 and S4 of the ceramic body 110 in the length direction. Here, the first internal electrodes 121 may serve as a signal.

In addition, the first internal electrodes 121 may have third and fourth lead-out portions 121a and 121b formed on both end portions thereof and extended to be exposed through the first main surface S1 which is the mounting surface of the ceramic body 110, respectively.

Here, the third and fourth lead-out portions 121a and 121b are extended from both end portions of the first internal electrodes 121 to be exposed through the second main surface S2 opposing the mounting surface of the ceramic body 110.

The second internal electrodes 122 may include a body overlapped with the adjacent internal electrodes and lead-out portions extended from a portion of the body to be exposed to the outside of the ceramic body 110 by.

Here, for example, the lead-out portions may have a length shorter than that of the internal electrodes configuring the body in the length direction of the ceramic body 110. However, the present disclosure is not particularly limited thereto.

In the present exemplary embodiment, a first lead-out portion 122b may be spaced apart from the first and second end surfaces S3 and S4 of the ceramic body 110 in the length direction, and may be extended from the second internal electrodes 122 to be exposed through the first main surface S1 which is the mounting surface of the ceramic body 110.

Here, the second internal electrodes 122 may further include a second lead-out portion 122a extended to be exposed through the second main surface which is the surface opposing the mounting surface of the ceramic body 110. The second internal electrodes 122 may serve as a ground.

The first and second external electrodes 131 and 132 may be disposed on the first and second end surfaces S3 and S4 of the ceramic body 110 in the length direction, and may contact the exposed both end portions of the first internal electrodes 121 to be electrically connected to each other.

The first and second external electrodes 131 and 132 may be utilized as a signal terminal, a terminal for power supply, or the like.

Here, the first and second external electrodes 131 and 132 may cover both end portions of the ceramic body 110 in the length direction.

In addition, the third and fourth external electrodes 133 and 134 may be disposed on the first main surface S1 which is the mounting surface of the ceramic body 110, to be spaced apart from each other in the width direction, and may contact the first lead-out portion 122b of the second internal electrode 122 to be electrically connected to each other.

The third and fourth external electrodes 133 and 134, which are electrodes having different polarities from those of the first and second external electrodes 131 and 132, may be utilized as a ground terminal in the present exemplary embodiment.

The third and fourth external electrodes 133 and 134 may be extended from the first main surface S1 of the ceramic body 110 onto portions of the third and fourth side surfaces S5 and S6 of the ceramic body 110 in the width direction.

In addition, when the second internal electrodes 122 have the second lead-out portion 122a, the third and fourth external electrodes 133 and 134 may be extended from the first main surface S1 of the ceramic body 110 through the third and fourth side surfaces S5 and S6 of the ceramic body 110 in the width direction, respectively, onto portions of the second main surface S2 opposing the first main surface S1 of the ceramic body 110, respectively. Portions of the third and fourth external electrodes 133 and 134 formed on the second main surface S2 of the ceramic body 110 may contact the second lead-out portion 122a of the second internal electrodes 122 to be electrically connected to each other.

In addition, the first to fourth external electrodes 131 to 134 may be formed by applying and sintering a conductive paste prepared by adding glass frit to a conductive metal powder. However, the present disclosure is not limited thereto. Here, for example, the conductive metal may be silver (Ag), nickel (Ni), copper (Cu), and the like. However, the present disclosure is not limited thereto.

Meanwhile, plating layers (not shown) may be formed on the first to fourth external electrodes 131 to 134, as necessary. The plating layers are to increase adhesion strength therebetween when the multilayer ceramic capacitor 100 is mounted on a board by a solder.

For example, the plating layers may include a nickel (Ni) plating layer formed on the first to fourth external electrodes 131 to 134 and a tin (Sn) plating layer formed on the nickel plating layer. However, the present disclosure is not limited thereto.

Board Having Multilayer Ceramic Capacitor

Figure 6:
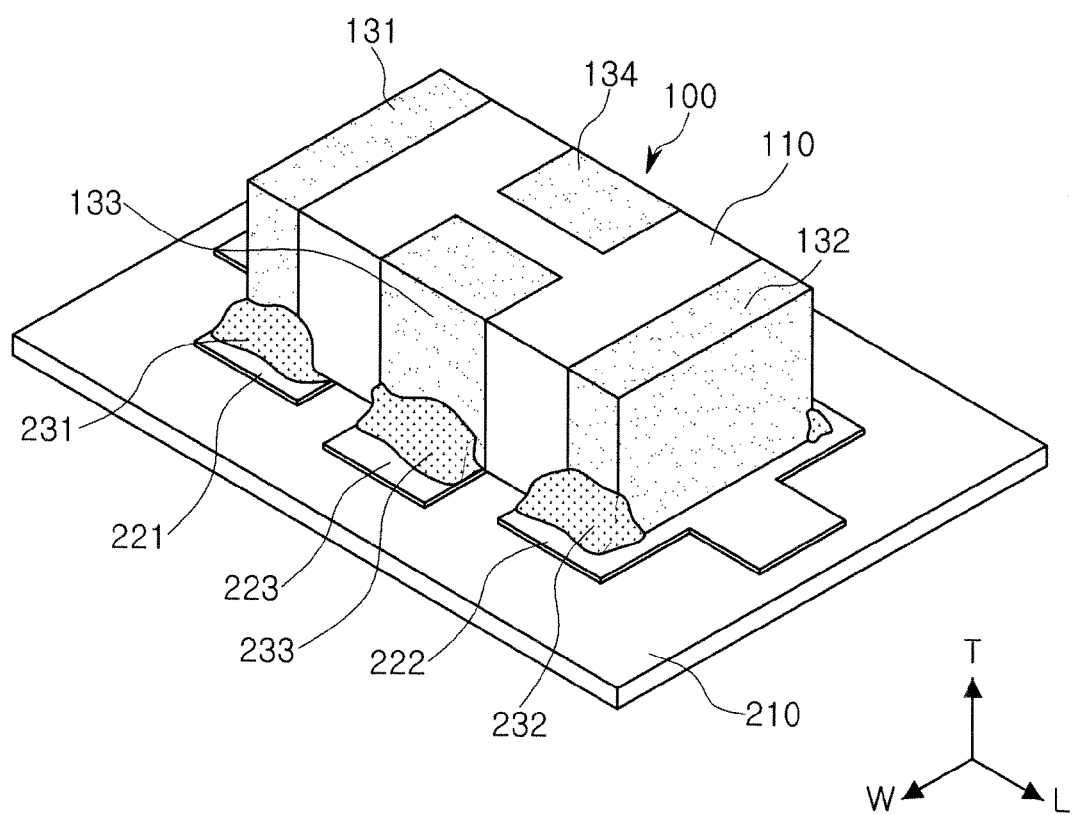
FIG. 6 is a perspective view illustrating a board on which the multilayer ceramic capacitor of FIG. 1 is mounted.

FIG. 6 is a perspective view illustrating a board on which the multilayer ceramic capacitor of FIG. 1 is mounted.

Referring to FIG. 6, aboard 200 on which the multilayer ceramic capacitor 100 according to an exemplary embodiment in the present disclosure is mounted may include a circuit board 210 on which the multilayer ceramic capacitor 100 is mounted, and first to fourth electrode pads 221, 222, and 223 formed on the circuit board 210 to be spaced apart from each other.

Here, the fourth electrode pad (not-shown) may be disposed on the circuit board 210 to face the third electrode pad 223 in the width direction and spaced apart from each other, and may contact a lower surface of the fourth external electrode 134 of the multilayer ceramic capacitor 100 to be electrically connected to each other.

In the multilayer ceramic capacitor 100, the first main surface S1 of the ceramic body 110 in the thickness direction may be disposed on the circuit board 210 as the mounting surface, and the first to fourth external electrodes 131 to 134 may be electrically connected to the circuit board 210 by solders 231 to 233 in a state in which the first to fourth external electrodes 131 to 134 are positioned to contact the first to fourth electrode pads 221, 222, 223, and not-shown), respectively.

In the existing three terminal penetration multilayer ceramic capacitor, since a DC current intensively flows through the internal electrode layer of the lowermost layer disposed to be adjacent to the board, local heat generation may occur, which deteriorates insulation resistance, thereby causing deterioration in reliability. However, according to an exemplary embodiment in the present disclosure, the current equally flows throughout the overall internal electrodes by the first and second regions (A, B, and C), such that possibility of deterioration in reliability may be decreased.

In the multilayer ceramic capacitor according to an exemplary embodiment in the present disclosure, the internal electrodes may be disposed to be perpendicular with respect to the board, and a positive electrode terminal and a negative electrode terminal may be adjacent to each other, such that a current path of the current flowing from the positive electrode terminal to the negative electrode terminal through the electrode pads of the board may shorten.

Therefore, as compared to the existing three terminal penetration multilayer ceramic capacitor in which the internal electrodes are disposed to be horizontal to the board, and a positive electrode terminal and a negative electrode terminal are relatively far apart from each other, the multilayer ceramic capacitor according to an exemplary embodiment in the present disclosure may have decreased equivalent series inductance (ESL), and as compared to the existing three terminal penetration multilayer ceramic capacitor, high frequency noise may be effectively removed according to an exemplary embodiment in the present disclosure.

As an example, when the multilayer ceramic capacitor 100 of FIG. 6 is used as a three terminal EMI filter, the first and second external electrodes 131 and 132 may be connected to an input terminal and an output terminal of signal lines, respectively, and the third and fourth external electrodes 133 and 134 may be connected to a ground terminal, such that the high frequency noise of the signal line may be effectively removed.

In this case, in the circuit board 210, the first and second electrode pads 221 and 222 which are positive (+) may correspond to the input terminal and the output terminal, respectively, and the third electrode pad 223 and the fourth electrode pad which are negative (−) may correspond to the ground terminal.

As another example, when the multilayer ceramic capacitor 100 of FIG. 6 is used as a decoupling capacitor, the first and second external electrodes 131 and 132 may be connected to a power supply line, and the third and fourth external electrodes 133 and 134 may be connected to a ground line, such that a power supply circuit may be effectively stabilized.

In this case, in the circuit board 210, the first and second electrode pads 221 and 222 may correspond to the power supply line, and the third electrode pad 223 and the fourth electrode pad may correspond to the ground line.

As set forth above, according to exemplary embodiments in the present disclosure, the direct-current resistance of the multilayer ceramic capacitor may be reduced, the allowable current (a maximum value of a current flowable through the capacitor) may be set to be high, loss of power in the capacitor may be decreased, and deterioration of reliability or life span due to self-heat generation may be prevented, such that when the multilayer ceramic capacitor is applied to a decoupling capacitor, an EMI filter, or the like, voltage fluctuation of the power supply circuit may be effectively suppressed, and a property in which the high frequency is reduced and an effect in which the high frequency noise is removed may be improved.

While exemplary embodiments have been shown and described above, it will be apparent to those skilled in the art that modifications and variations could be made without departing from the scope of the present disclosure as defined by the appended claims.

What is claimed is:

1. A multilayer ceramic capacitor comprising:
a ceramic body including a plurality of dielectric layers;
first internal electrodes exposed through both end surfaces of the ceramic body;
second internal electrodes having a first lead-out portion extended to be exposed through a mounting surface of the ceramic body and spaced apart from both end surfaces of the ceramic body;
first and second external electrodes disposed on both end surfaces of the ceramic body and connected to both end portions of the first internal electrodes, respectively; and
third and fourth external electrodes disposed on the mounting surface of the ceramic body to be spaced apart from each other in the width direction and connected to the first lead-out portion of the second internal electrodes;
wherein the ceramic body includes a first region positioned in a center portion thereof in the width direction and second regions positioned in both side portions of the ceramic body in the width direction, with the first region interposed therebetween, the plurality of first internal electrodes are disposed in the first region, with the dielectric layer interposed therebetween, and the first and second internal electrodes are alternately disposed in the second regions, with the dielectric layer interposed therebetween,
wherein the second internal electrodes have a second lead-out portion extended to be exposed through a surface opposing the mounting surface of the ceramic body, and
the third and fourth external electrodes are extended from the mounting surface of the ceramic body through both side surfaces of the ceramic body, respectively, onto portions of the surface opposing the mounting surface of the ceramic body, respectively, and are connected to the second lead-out portion.

2. The multilayer ceramic capacitor of claim 1, wherein the third and fourth external electrodes are extended from the mounting surface of the ceramic body onto portions of both side surfaces of the ceramic body, respectively.

3. The multilayer ceramic capacitor of claim 1, wherein the first internal electrodes have third and fourth lead-out portions formed on both end portions thereof and extended to be exposed through the mounting surface of the ceramic body, respectively.

4. The multilayer ceramic capacitor of claim 3, wherein the third and fourth lead-out portions are extended from both end portions of the first internal electrodes to be exposed through a surface opposing the mounting surface of the ceramic body.

5. A board having a multilayer ceramic capacitor, comprising:
a circuit board having first to third electrode pads disposed thereon; and
a multilayer ceramic capacitor mounted on the circuit board,
wherein the multilayer ceramic capacitor includes:
a ceramic body including a plurality of dielectric layers;
first internal electrodes exposed through both end surfaces of the ceramic body;
second internal electrodes having a first lead-out portion extended to be exposed through a mounting surface of the ceramic body and spaced apart from both end surfaces of the ceramic body;
first and second external electrodes disposed on both end surfaces of the ceramic body, connected to both end portions of the first internal electrodes, respectively, and formed on the first and second electrode pads; and
third and fourth external electrodes disposed on the mounting surface of the ceramic body to be spaced apart from each other in the width direction and connected to the first lead-out portions of the second internal electrodes,
wherein the ceramic body includes a first region positioned in a center portion thereof in the width direction and second regions positioned in both side portions in the width direction, with the first region interposed therebetween, the plurality of first internal electrodes are disposed in the first region, with the dielectric layer interposed therebetween, and the first and second internal electrodes are alternately disposed in the second regions, with the dielectric layer interposed therebetween,
wherein the second internal electrodes have a second lead-out portion extended to be exposed through a surface opposing the mounting surface of the ceramic body, and
the third and fourth external electrodes are extended from the mounting surface of the ceramic body through both side surfaces of the ceramic body, respectively, onto portions of the surface opposing the mounting surface of the ceramic body, respectively, and are connected to the second lead-out portion.

6. The board of claim 5, wherein the third and fourth external electrodes are extended from the mounting surface of the ceramic body onto portions of both side surfaces of the ceramic body, respectively.

7. The board of claim 5, wherein the first internal electrodes have third and fourth lead-out portions formed on both end portions and extended to be exposed through the mounting surface of the ceramic body, respectively.

8. The board of claim 7, wherein the third and fourth lead-out portions are extended from both end portions of the first internal electrodes to be exposed through a surface opposing the mounting surface of the ceramic body.

* * * * *